(12) United States Patent
Yang et al.

(10) Patent No.: US 10,090,358 B2
(45) Date of Patent: Oct. 2, 2018

(54) CAMERA MODULE IN A UNIBODY CIRCUIT CARRIER WITH COMPONENT EMBEDDING

(71) Applicant: Apple Inc., Cupertino, CA (US)

(72) Inventors: Annabelle Q. Yang, Singapore (SG); Steven Webster, Singapore (SG); Reynaldo Vincent H. Sta Agueda, Singapore (SG); Christopher Hunat, Maidenhead (GB)

(73) Assignee: Apple Inc., Cupertino, CA (US)

( * ) Notice: Subject to any disclaimer, the term of this patent is extended or adjusted under 35 U.S.C. 154(b) by 87 days.

(21) Appl. No.: 15/234,790

(22) Filed: Aug. 11, 2016

(65) Prior Publication Data

US 2017/0048472 A1 Feb. 16, 2017

Related U.S. Application Data

(60) Provisional application No. 62/203,804, filed on Aug. 11, 2015.

(51) Int. Cl.
*H01L 27/146* (2006.01)
*H04N 5/225* (2006.01)

(52) U.S. Cl.
CPC .. *H01L 27/14687* (2013.01); *H01L 27/14618* (2013.01); *H01L 27/14632* (2013.01);
(Continued)

(58) Field of Classification Search
CPC ........... H05K 3/284; H05K 2203/1316; H05K 2201/10151; H04N 5/2253; H04N 5/2254; H04N 5/2257; H04N 7/157; H01L 21/563–21/566; H01L 21/67126; H01L 23/28; H01L 23/293–23/296;
(Continued)

(56) References Cited

U.S. PATENT DOCUMENTS 8,232,131 B2 7/2012 Kim
2007/0210246 A1* 9/2007 Ellenberger ...... H01L 27/14618
250/239

(Continued)

FOREIGN PATENT DOCUMENTS

CN 204156950 2/2015
WO WO-2014072114 5/2014

*Primary Examiner* — Lin Ye
*Assistant Examiner* — Chriss Yoder, III
(74) *Attorney, Agent, or Firm* — Womble Bond Dickinson (US) LLP (57) ABSTRACT

A camera module assembly including a circuit carrier substrate having a first region integrally formed with a second region, the second region being movable with respect to the first region. The camera module assembly may further include an image sensor device positioned within a cavity formed in the first region of the circuit carrier substrate. The image sensor device may have a conductive via and a redistribution layer formed therein. The conductive via and the redistribution layer are electrically connected to the circuit carrier substrate along the side of the image sensor device facing the circuit carrier substrate. The camera module assembly further includes an electronic component positioned within a second cavity formed in the first region, the electronic component being electrically connected to the circuit carrier substrate.

20 Claims, 8 Drawing Sheets

(52) U.S. Cl.
CPC .. *H01L 27/14636* (2013.01); *H01L 27/14645* (2013.01); *H04N 5/2253* (2013.01); *H04N 5/2257* (2013.01); *H01L 2224/16225* (2013.01); *H01L 2224/73204* (2013.01)

(58) Field of Classification Search
CPC .............. H01L 23/3142; H01L 23/315; H01L 27/14618; H01L 27/14632; H01L 27/14634; H01L 27/14636; H01L 27/14645; H01L 27/14683; H01L 27/14687; H01L 27/1469; H01L 2933/005; H01L 2224/16225; H01L 2224/73204
See application file for complete search history.

(56) References Cited

U.S. PATENT DOCUMENTS

2011/0228390 A1    9/2011   Lin
2014/0049686 A1    2/2014   Chen

* cited by examiner

CAMERA MODULE IN A UNIBODY CIRCUIT CARRIER WITH COMPONENT EMBEDDING

CROSS-REFERENCE TO RELATED APPLICATIONS

This application claims the benefit of the earlier filing date of U.S. Provisional Patent Application No. 62/203,804, filed Aug. 11, 2015 and incorporated herein by reference.

FIELD

Embodiments related to a camera module in a unibody circuit carrier are disclosed. More particularly, an embodiment related to a camera module and electronic component embedded within cavities of a unibody carrier is disclosed.

BACKGROUND

Camera modules have been incorporated into a variety of consumer electronics devices, including smart phones, mobile audio players, personal digital assistants, and both portable and desktop computers. These devices, however, have a relatively low profile or rise (e.g. height as defined along the z-axis) and therefore components housed within these devices (e.g. camera modules) must also have a relatively low rise.

A typical camera module, however, includes several components, which are typically stacked one on top of the other. For example, a camera module generally includes an optical system used to collect and transmit light from an imaged scene to an image sensor. The image sensor is typically mounted on top of an integrated circuit die or substrate. The image sensor is electrically connected to interconnects formed within the substrate by wires bonded between a pixel area side of the image sensor (e.g. a top side) and the substrate. The optical system, which may include a lens barrel having at least one or more lenses and a voice coil motor assembly, is stacked on top of the image sensor. The stacking of each of these components one on top of another, however, adds to the overall z-height of the camera module. In addition, the use of wires to connect the image sensor to the substrate may undesirably increase the overall x, y and z dimensions of the camera module because, for example, additional space may be needed between the image sensor and the substrate to accommodate the wires and bonding of the wires to the substrate surface.

SUMMARY

A camera module assembly, particularly for use in portable consumer electronics device applications, is disclosed. In one embodiment, the camera module assembly includes a circuit carrier substrate having a first region integrally formed with a second region, the second region being movable with respect to the first region. For example, in one embodiment, the first region is rigid and the second region is flexible. The camera module assembly may further include an image sensor device positioned within a cavity formed in the first region of the circuit carrier substrate. The bottom surface of the cavity may be flat to accommodate the image sensor device. The image sensor device may have a conductive via and a redistribution layer formed therein. The conductive via and the redistribution layer are electrically connected to the circuit carrier substrate along the side of the image sensor device facing the circuit carrier substrate. The conductive via may be a through silicon via electrically connected to the circuit carrier substrate by the redistribution layer. In some aspects, the camera module may further include an electronic component embedded in the first region of the circuit carrier substrate and electrically connected to the circuit carrier substrate. The electronic component may be an active electronic component partially embedded within the first region of the circuit carrier substrate. In other cases, the electronic component is a passive electronic component completely embedded within the first region of the circuit carrier substrate. Additionally, the camera module assembly may include an image sensor device within the cavity. In some embodiments, a conductive material is applied between a bottom surface of the cavity and the image sensor device to electrically connect the conductive via to the circuit carrier substrate. In addition, a voice coil motor assembly may be positioned over the image sensor device and attached to the first region of the circuit carrier substrate.

In another embodiment, the camera module assembly includes a circuit carrier substrate having a first cavity and a second cavity, each of the first cavity and the second cavity having a bottom surface and an opening along a top side of the circuit carrier substrate. An image sensor device is positioned within the first cavity of the circuit carrier substrate. The image sensor device includes an image capture side facing the opening of the first cavity and a connection side facing the bottom surface of the first cavity. In addition, the image sensor device includes a conductive via extending between the image capture side and the connection side. The conductive via is electrically connected to the circuit carrier substrate at the connection side of the image sensor device. The assembly may further include an electronic component positioned within a second cavity formed in the first region. The electronic component may be electrically connected to the circuit carrier substrate. In addition, the camera module assembly may further include a redistribution layer to electrically connect the conductive via to the circuit carrier substrate. In one aspect, the first cavity and the second cavity are formed within a first region of the circuit carrier substrate, and the circuit carrier substrate further comprises a second region that is thinner than the first region. The first region and the second region may be integrally formed as one inseparable carrier structure. The circuit carrier substrate may include plurality of substrate layers. In one aspect, more than at least one of the plurality of substrate layers extends continuously from a first end to a second end of the circuit carrier substrate. In addition, a z-height of the first cavity is greater than or equal to a z-height of the image sensor device and the image sensor device does not extend through the first cavity opening. In addition, the electronic component may be completely embedded within the second cavity. In other cases, the electronic component is exposed through the opening in the second cavity.

In another embodiment, a process of producing a camera module assembly includes providing an integrally formed circuit carrier substrate having a first region and a second region that is movable with respect to the first region, and a first cavity and a second cavity within the first region. The process further includes positioning an image sensor device within the first cavity and an electronic component within the second cavity. The image sensor device may have an image capture side exposed through an opening of the first cavity and a connection side facing a bottom surface of the first cavity, a conductive via extending between the image capture side and the connection side, and a redistribution layer formed within the connection side. The process further including applying a conductive material between the connection side of the image sensor device and the bottom surface of the first cavity to electrically connect the conductive via and the redistribution layer to the circuit carrier substrate. The process may further include introducing an embedding material into the second cavity to embed the electronic component within the second cavity.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment in this disclosure are not necessarily to the same embodiment, and they mean at least one.

DETAILED DESCRIPTION

Embodiments describe camera module assemblies, particularly for use in portable consumer electronics device applications. However, while some embodiments are described with specific regard to integration within mobile electronics devices, the embodiments are not so limited and certain embodiments may also be applicable to other uses. For example, a camera module assembly as disclosed herein may be incorporated into an electronic device that remains at fixed locations, or used in relatively stationary applications, e.g., as a lens in a multimedia disc player or desk top device having a display.

In various embodiments, description is made with reference to the figures. However, certain embodiments may be practiced without one or more of these specific details, or in combination with other known methods and configurations. In the following description, numerous specific details are set forth, such as specific configurations, dimensions, and processes, in order to provide a thorough understanding of the embodiments. In other instances, well-known processes and manufacturing techniques have not been described in particular detail in order to not unnecessarily obscure the description. Reference throughout this specification to "one embodiment," "an embodiment", or the like, means that a particular feature, structure, configuration, or characteristic described is included in at least one embodiment. Thus, the appearance of the phrase "one embodiment," "an embodiment," or the like, in various places throughout this specification are not necessarily referring to the same embodiment. Furthermore, the particular features, structures, configurations, or characteristics may be combined in any suitable manner in one or more embodiments.

The use of relative terms throughout the description, such as "top" and "bottom" may denote a relative position or direction. For example, a "top edge", "top end" or "top side" may be directed in a first axial direction and a "bottom edge", "bottom end" or "bottom side" may be directed in a second direction opposite to the first axial direction. However, such terms are not intended to limit the use of the camera module disclosed herein to a specific configuration described in the various embodiments below. For example, a top side of a camera module or its components (e.g. an image sensor) may be directed in any direction with respect to an external environment.

Figure 1:
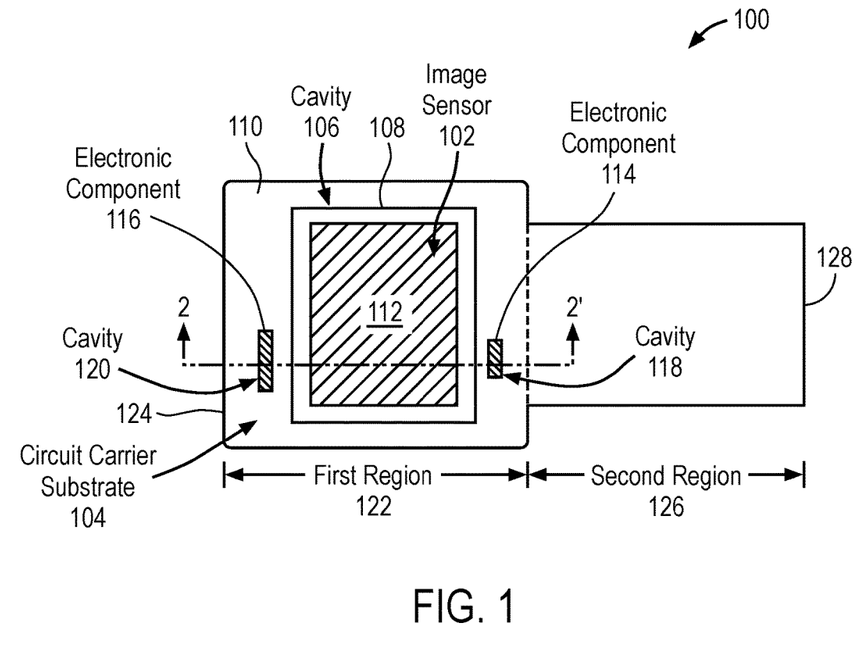
FIG. 1 is a top plan view of one embodiment of a camera module assembly including a circuit carrier substrate.

FIG. 1 is a top plan view of one embodiment of a camera module assembly including a circuit carrier substrate. The camera module assembly 100 is shown in FIG. 1 with the voice coil motor and lens assembly removed so that the relationship between the image sensor 102 and circuit carrier substrate 104 can be more clearly shown. In particular, from this view, it can be seen that image sensor 102 is positioned within a cavity 106 formed in circuit carrier substrate 104. In this aspect, a low overall profile of the camera module assembly 100 can be maintained. Cavity 106 includes an opening 108 through the top side 110 of circuit carrier substrate 104 such that when the image sensor 102 is positioned within cavity 106, the image capture side 112 (i.e. the active side having an array of pixel sensors) of image sensor 102 is exposed and a connection side (not shown) faces the bottom of the cavity 106.

In still further embodiments, additional electronic components, for example electronic components 114, 116 may be positioned within additional cavities 118, 120, respectively, within circuit carrier substrate 104. For example, in one embodiment, electronic component 114 may be a passive component positioned within cavity 118 and electronic component 116 may be an active component positioned within cavity 120. Representative passive components may include any electronic component that consumes (but does not produce) energy, or a component that is incapable of power gain, for example, a capacitor or resistor. Representative active components may include any electronic component that is capable of power gain, for example, a transistor or integrated circuit. Positioning of electronic components 114, 116 within their respective cavities 118, 120 further helps to maintain an overall low profile of camera module assembly 100. In addition, in some embodiments, electronic components 114, 116 may be partially or fully embedded within their respective cavities 118, 120 as will be described in more detail in reference to FIG. 8-FIG. 9. For example, where electronic component 114 is a passive component, whose functionality does not require it to be exposed outside of circuit carrier substrate 104, it may be fully embedded (i.e. completely covered with an embedding material) within cavity 118. In other embodiments, where electronic component 116 is an active component, whose functionality requires it to be exposed outside of circuit carrier substrate 104, it may be partially embedded within cavity 118 such that it is not completely covered by an embedding material. It should further be understood that although two additional electronic components 114, 116 and corresponding cavities 118, 120 are shown, any number of cavities having electronic components therein may be formed within circuit carrier substrate 104.

Each of cavities 106, 118, 120 may be formed within a first region 122 of circuit carrier substrate 104. First region 122 is considered to be the portion of circuit carrier substrate 104, which is near, or extends from, a first end 124 of circuit carrier substrate 104. Circuit carrier substrate 104 may further include a second region 126, which is near, or extends from, a second end 128 of circuit carrier substrate 104 toward the first region 122. The first region 122 is different from the second region 126 in that the first region 122 is considered rigid and the second region 126 is considered flexible. As used herein, the term "rigid" means a structure with two-dimensional and/or three-dimensional stability allowing no deformation, bending or an otherwise change in shape or profile of the structure upon application of an external force. In other words, first region 122 of circuit carrier substrate 104 is considered stiff, non-pliant, non-compliant or otherwise does not bend upon application of a bending force. Rather, application of a bending force to first region 122 of circuit carrier substrate 104 would cause first region 122 to break. The term "flexible" as used herein means providing a structure with no considerable resistance against deformation or change in shape or profile of the structure. In other words, second region 126 of circuit carrier substrate 104 is pliant, compliant or bendable without breaking upon application of a bending force. Said another way, first region 122 is considered less pliant, less compliant, less flexible, or less bendable than second region 126. Similarly, second region 126 is more pliant, more compliant, more flexible or more bendable than first region 122. In this aspect, while first region 122 is considered to have a fixed or stiff configuration and cannot conform to the dimensions of a device within which the camera module assembly 100 is mounted, second region 126 is modifiable and may be bent so that it can conform to (e.g., bend around) the device dimensions. In other words, second region 126 is movable, or can be bent, with respect to first region 122.

Although first region 122 is less pliant (i.e. first region 122 is rigid) than second region 126 (i.e. second region 126 is flexible), it should be understood that both regions of circuit carrier substrate 104 are integrally formed as one continuous piece such that circuit carrier substrate 104 is considered a uniform or unibody circuit carrier substrate. Said another way, circuit carrier substrate 104 is a homogenous circuit carrier substrate in that both the rigid and flexible regions (e.g. first and second regions 122, 126) are formed by a stack up of a number of the same substrate layers. For example, circuit carrier substrate 104 may include one or more substrate layers (e.g. dielectric layers) extending continuously from first end 124 to second end 128. A number of patterned circuit layers may be sandwiched between the substrate layers. In one embodiment, circuit carrier substrate 104 may include more substrate layers in the first region 122 than the second region 126 such that first region 122 is less pliant, or rigid, in comparison to second region 126. First region 122 and second region 126 are, however, formed by at least one or more of the same continuous substrate layers such that circuit carrier substrate 104 has a uniform or homogenous structure. This is in contrast to, for example, flex-rigid circuit boards which are formed by two separately formed pieces, for example, a flexible circuit and a printed circuit board, that are attached as two separate pieces to one another (e.g. soldered).

Figure 2:
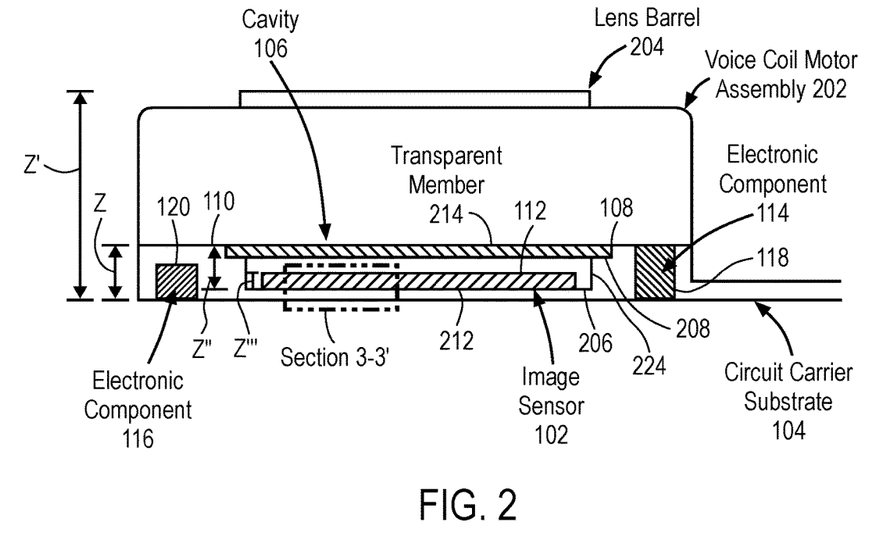
FIG. 2 is a cross-sectional side view of the camera module assembly and circuit carrier substrate of FIG. 1 along line 2-2'.

FIG. 2 is a cross-sectional side view of the camera module assembly and circuit carrier substrate of FIG. 1 along line 2-2'. From this view, the relatively low profile or z-height (i.e. thickness) of camera module assembly 100 can be seen. In particular, because the image sensor 102 and other electronic components 114, 116 are mounted within respective cavities 108, 118, 120 within circuit carrier substrate 104, the overall z-height of the image sensor assembly, identified as Z in FIG. 2, is determined by the z-height or thickness of the circuit carrier substrate 104 alone, and is not increased due to the image sensor or other electronic components electrically connected to circuit carrier substrate 104. In addition, the voice coil motor assembly 202 and the lens barrel 204 can be mounted directly on the top side 110 of circuit carrier substrate 104 thereby further reducing the overall z-height of the camera module assembly 100, identified as Z' in FIG. 2. This is in contrast to a camera module assembly having an image sensor mounted to a top side of the carrier substrate, and then the voice coil motor assembly and lens barrel mounted above the image sensor, for example, to a separate casing around the image sensor and carrier.

Referring to cavity 106 in more detail, it can be seen from FIG. 2 that a z-height of cavity 106, represented by Z" in FIG. 2, is greater than a z-height of image sensor 102, represented by Z'". As such, image sensor 102 does not extend through the cavity opening 108 or otherwise above the top side 110 of circuit carrier substrate 104. The z-height of cavity 106 (i.e. Z") with respect to the z-height of image sensor 102 (i.e. Z'") further helps to maintain a low profile module in that it allows image sensor 102 to be completely confined to a thickness of cavity 106 and not extend above top side 110 of cavity 106. It should be understood, however, that although Z" of cavity 106 is shown as being greater than Z'" of image sensor 102, they may also be substantially equal.

In addition, cavity 106 includes a substantially flat bottom surface 206. Said another way, bottom surface 206 of cavity 106 may be planar, and in some cases, form a ninety degree angle with sidewalls 224 of cavity 106. It should be understood that because image sensor 102 is electrically connected to circuit carrier substrate 104 through the bottom side 212, it is important that the bottom surface 206 of cavity 106 be flat or planar. In particular, the bottom side 212 of image sensor 102 is also relatively flat. Therefore, in order to maintain a close proximity between contact points (e.g. pads) at the bottom side 212 of image sensor 102 and contact points at the bottom surface 206 of cavity 106, these interfacing surfaces should be complementary, or otherwise substantially the same (i.e. flat). A cavity 106 having an uneven or sloping bottom surface 206 may not allow for proper electrical connection between image sensor 102 and circuit carrier substrate 104.

Cavity 106 may also, in some embodiments, include a receiving channel 208 formed within the top portion of sidewalls 224 of cavity 106. Receiving channel 208 is dimensioned to receive and support a transparent member 214 over image sensor 102. In this aspect, receiving channel 208 may form a step like structure in sidewalls 224 upon which transparent member 214 may be positioned so that it is within cavity 106 and held above image sensor 102. Transparent member 214 may, for example, be a glass cover or similar transparent structure, which can enclose image sensor 102 within cavity 106 without blocking light transmission to image sensor 102. It is further noted that receiving channel 208 may have a z-height substantially similar to, or greater than, the thickness of transparent member 214 so that transparent member 214 does not protrude above top side 110 of circuit carrier substrate 104, thereby further maintaining a relatively low z-height of the overall system.

Figure 3:
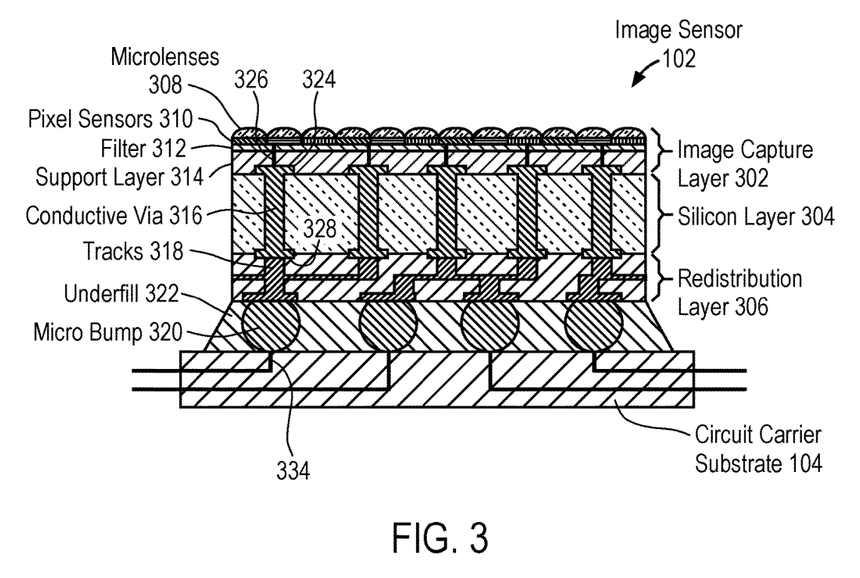
FIG. 3 is a magnified view of section 3-3' of the camera module assembly and circuit carrier substrate of FIG. 3.

Further details of the image sensor 102 will now be described in reference to FIG. 3, which is a magnified view of section 3-3' of FIG. 2. From this view, it can be seen that image sensor 102 includes a stack up of an image capture side or layer 302, a silicon layer 304 and a redistribution layer 306. The image capture layer 302 (which faces opening 108 of cavity 106) may include a color filter layer 312, pixel sensors 310 positioned along a top side of the filter layer 312 and microlenses 308 positioned over the pixel sensors 310. A support layer 314 may further be provided between the filter layer 312 and silicon layer 304 to, for example, space, and in some cases insulate, the components of the image capture layer 302 from components within the silicon layer 304. For example, support layer 314 may be, for example, an insulating layer, which insulates conductive components in image capture layer 302 from those within silicon layer 304.

Silicon layer 304 may include one or more of a conductive via 316, which extends entirely through a thickness of silicon layer 304. Representatively, conductive via 316 may be considered a through silicon via (TSV) which extends from the top side to the bottom side of silicon layer 304. Conductive via 316 may have a conductive interconnect pad 324 electrically connected to the top end (e.g. at a top side of silicon layer 304) and a conductive interconnect pad 328 electrically connected to the bottom end of conductive via 316 (e.g. at a bottom side of silicon layer 304). Conductive interconnect pad 324 may be used to electrically connect conductive via 316 to one or more components of image capture layer 302 (e.g. pixel sensors 310 or filter 312) using one or more of a conductive traces or tracks 326 formed through the support layer 314. Conductive interconnect pad 328 at the bottom end of conductive via 316 may, in turn, be used to electrically connect conductive via 316 and any electrically connected components at the top side of image sensor 102 (e.g. pixel sensors 310 or filter 312) to circuit carrier substrate 104. In this aspect, the electrical connection between components along the top side of image sensor 102 and the circuit carrier substrate 104 are made at the bottom side of image sensor 102 instead of the top side (e.g. image capture layer 302). This, in turn, helps to maintain a relatively low profile of the image sensor module and camera module assembly overall because it eliminates the need for additional space along the top side of the image sensor to accommodate wiring between the top side of the image sensor and the circuit carrier substrate, which can increase the z-height.

Image sensor 102 may further include a redistribution layer 306 below silicon layer 304. Redistribution layer 306 may, in one aspect, serve to distribute and reduce, for example, the number of external pad connections (e.g. input/output pad connections), which further reduces z-height because fewer signal lines are routed internally to image sensor 102. In one embodiment, redistribution layer 306 may include redistribution layer traces or tracks 318 formed within a layer of insulating material. One or more of the redistribution layer tracks 318 may be electrically connected to the image sensor components along the top side of image sensor 102 (e.g. pixel sensors 310 or filter 312) through a conductive via 316. For example, one or more of redistribution layer tracks 318 may be electrically connected at one end to a conductive interconnect pad 328 at the bottom end of conductive via 316 (which is connected to image capture layer 302 at its top end) and at another end to circuitry 334 within circuit carrier substrate 104. In this aspect, redistribution layer 306 may also be considered a connection side of image sensor 102 which faces the bottom surface 206 of cavity 106 when positioned therein. In one embodiment, a conductive micro bump 320 (e.g. a solder micro bump) on the bottom side (i.e. connection side) of image sensor 102 may be used to electrically connect redistribution layer tracks 318 to circuit carrier substrate 104. Although a micro bump 320 is shown, it is further contemplated that any conductive adhesive may be used to establish an electrical connection between image sensor 102 and circuit carrier substrate 104, for example, a solder paste.

In still further embodiments, an underfill layer 322 may be applied around each of micro bump 320 to protect the micro bump connections. The underfill layer 322 may be made up of, for example, an electrically insulating material (e.g. a glass or polymer).

Figure 4:
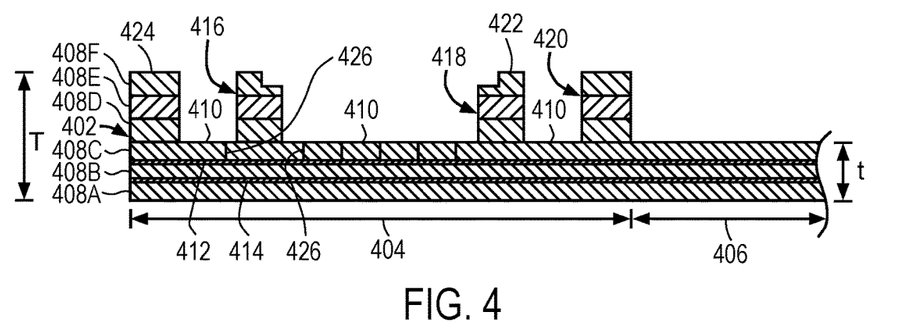
FIG. 4 is a pictorial view illustrating an operation for forming a camera module in accordance with one embodiment.

FIG. 4-FIG. 9 are pictorial views illustrating operations in forming a camera module in accordance with an embodiment. Referring to FIG. 4, FIG. 4 illustrates one embodiment of a circuit carrier substrate 402 having a first region 404 and a second region 406. The first region 404 may be rigid and the second region 406 may be flexible as previously discussed in reference to FIG. 1. Circuit carrier substrate 402 may further include a number of substrate layers 408A, 408B, 408C, 408D, 408E and 408F (e.g. insulating layers) stacked on top of one another and extending between the first region 404 and second region 406. Conductive layers 412A and 412B are formed between any one or more of the substrate layers 408A-408F, in this case, layers 408A-408B and layers 408B-408C, respectively. Conductive layers 412A and 412B are, for example, metallic layers that form the circuitry within circuit carrier substrate 402 and allow for transmission of electrical signals through circuit carrier substrate 402.

At least one or more of the substrate layers 408A-408F may extend continuously between the first region 404 and the second region 406 such that both regions may be formed by, for example, two or more of the same substrate layers 408A-408F. For example, in the embodiment shown in FIG. 4, layers 408A-408C extend continuously between the first region 404 and the second region 406. In this aspect, circuit carrier substrate 402 is considered to be a unibody or homogenous carrier as previously discussed in reference to FIG. 1. Although first region 404 and second region 406 may be made of the same materials, the rigidity of first region 404 and flexibility of second region 406 may be achieved, in one embodiment, due to the different thicknesses (or z-heights) of first region 404 with respect to second region 406. For example, first region 404 may have a thickness (T) (or z-height) that is greater than a thickness (t) (or z-height) of second region 406. In other words, first region 404 includes more of substrate layers 408A-408F than second region 406 such that first region 404 is rigid, or more rigid, than second region 406. Said another way, first region 404 may include a stack up of enough of substrate layers 408A-408F that, in combination, result in a rigid structure or region. Second region 406, in turn, may include fewer of substrate layers 408A-408F such that it is flexible or can otherwise be bent upon application of a bending force. Said another way, second region 406 is thinner than first region 404.

In addition, as can be seen from FIG. 4, cavities 416, 418, 420 are formed through one or more of substrate layers 408A-408F. For example, cavities 416, 418, 420 may be formed by cutting, or punching, an opening through one or more of substrate layers 408A-408F until a desired cavity depth suitable for embedding an electronic device within the cavity is reached. Representatively, cavities 416, 418, 420 may be formed by cutting openings through substrate layers 408D-408F and removing unwanted portions of the substrate layers 408A-408F. It is further noted that it is important that the bottom surfaces 410 of each of cavities 416, 418, 420 are flat, or otherwise planar. Said another way, the top side of the substrate layer, in this case substrate layer 408C, forming the bottom surfaces 410 of cavities 416, 418, 420 should be flat or planar. It is important that the bottom surfaces 410 of cavities 416, 418, 420 be flat so that electrical connections can be made between the bottom side of the electronic device (e.g. an image sensor) placed within the cavity and the circuit carrier substrate 402 with minimal z-height impact.

Cavities 416, 418, 420 are formed along the top side 424 of circuit carrier substrate 402. Cavity 418 may further include a receiving channel 422, which forms a step like structure within the top of cavity 418 to accommodate, for example, the insertion of a transparent member or cover as will be discussed in more detail in reference to FIG. 7. In addition, circuitry 426 may be formed between the bottom of one or more of cavity 416, 418, 420 such that an electronic device or component positioned within the cavity can be electrically connected to conductive layers 412, 414 within circuit carrier substrate 402 from a bottom side of the device as previously discussed.

Figure 5:
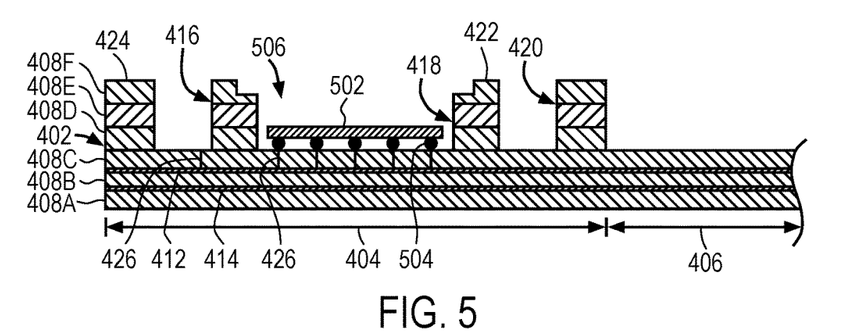
FIG. 5 is a pictorial view illustrating an operation for forming a camera module in accordance with one embodiment.

FIG. 5 illustrates the further processing step of positioning an image sensor 502 within cavity 418. Image sensor 502 may be substantially the same as image sensor 102 discussed in reference to FIG. 1-FIG. 3. Image sensor 502 is placed within cavity 418 by inserting it through the opening 506 at the top side 424 of circuit carrier substrate 402. From this view, it can be seen that each of the micro bumps 504 attached to the bottom of the image sensor 502 as previously discussed, align with, and are electrically connected to, circuitry 426 within circuit carrier substrate 402.

Figure 6:
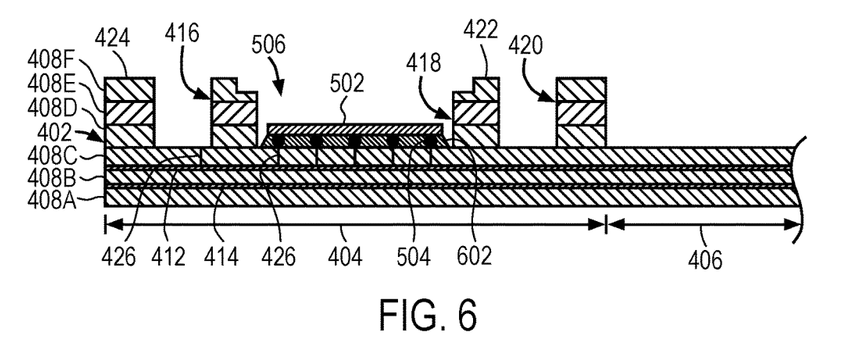
FIG. 6 is a pictorial view illustrating an operation for forming a camera module in accordance with one embodiment.

FIG. 6 illustrates the further processing step of forming an underfill layer 602 around micro bumps 504. The underfill layer 602 may be formed by, for example, applying an underfill material (e.g. an electrically insulating material) into cavity 418 until it surrounds micro bumps 504. The underfill layer 602 therefore provides a protective layer around the electrical micro bump connections.

Figure 7:
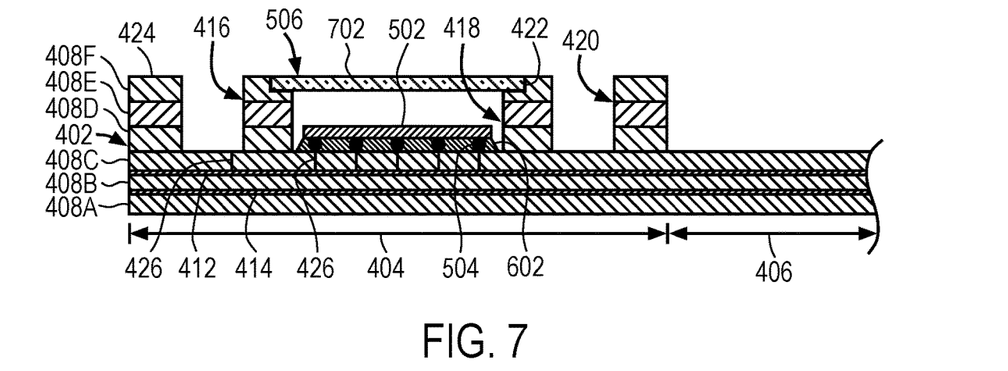
FIG. 7 is a pictorial view illustrating an operation for forming a camera module in accordance with one embodiment.

FIG. 7 illustrates the further processing step of mounting a transparent member 702 within the receiving channel 422 of cavity 418. Transparent member 702 may be substantially the same as transparent member 214 described in reference to FIG. 2. Transparent member 702 may be mounted within receiving channel 422 using, for example an epoxy material applied between interfacing surfaces of the transparent member 214 and receiving channel 422.

Figure 8:
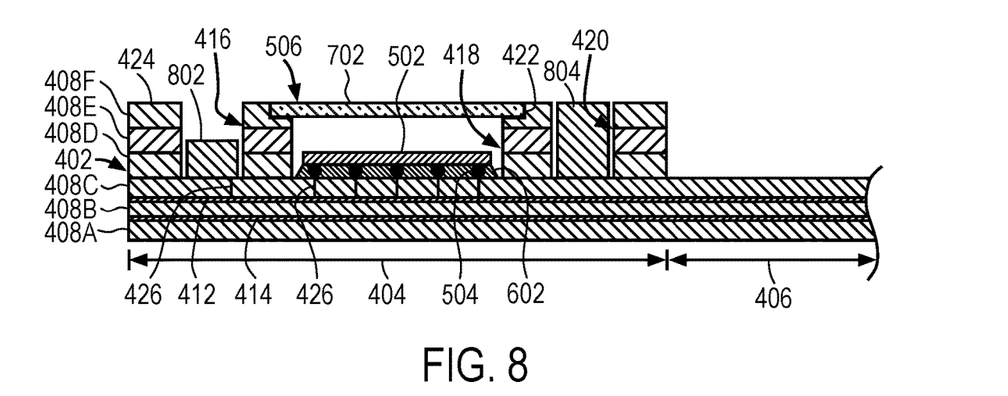
FIG. 8 is a pictorial view illustrating an operation for forming a camera module in accordance with one embodiment.

FIG. 8 illustrates the further processing step of mounting electronic components 802, 804 within cavities 416, 420, respectively. Representatively, electronic components 802, 804 may be passive or active electronic components such as components 114, 116 previously discussed in reference to FIG. 2. Each of electronic components 802, 804 may be placed within their respective cavities 416, 420 by inserting them through their respective openings in the top side 424 of circuit carrier substrate 402.

Figure 9:
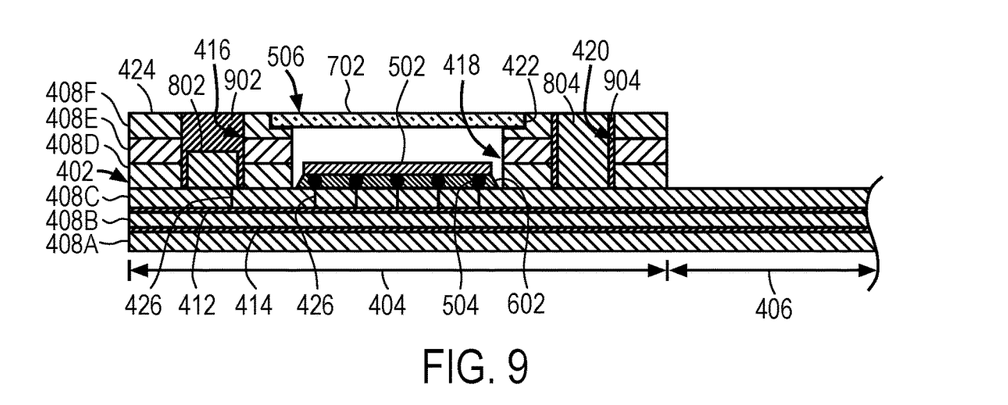
FIG. 9 is a pictorial view illustrating an operation for forming a camera module in accordance with one embodiment.

FIG. 9 illustrates the further processing step of embedding one or more of electronic components 802, 804 within cavities 416, 420, respectively. In one embodiment, electronic component 802 is completely embedded within cavity 416 by applying an embedding material 902 entirely around electronic component 802. In other words, embedding material 902 completely fills cavity 416 such that electronic component 802 is not exposed through the opening of cavity 416. Electronic component 804 is shown partially embedded within cavity 420 by the embedding material 902 such that the top side of electronic component 804 is exposed through the opening in cavity 420. The embedding material 902, 904 may be, for example, a polymer, an epoxy resin or any other material suitable for embedding electronic components or devices within a circuit carrier substrate. It can further be seen from this view that because each of the electronic components (e.g. image sensor 502, electronic component 802 and electronic component 804) are within cavities and therefore do not extend above the top side 424 of circuit carrier substrate 402, the z-height of the overall image sensor module is relatively low and does not need to be increased in order to accommodate any electronic components mounted thereto. In other words, the overall z-height of the image sensor module is the same as, or otherwise defined by, the z-height or thickness of the circuit carrier substrate 402. In addition, since, as previously discussed, electrical connections between the image sensor 502 and circuit carrier substrate 402 are made at the bottom side of the image sensor 502 using internal conductive vias and redistribution layers within the image sensor 502, external wiring and the space need for such wiring is eliminated. This, in turn, further helps to reduce an x, y and/or z dimension of the image sensor module and the camera module overall.

Figure 10:
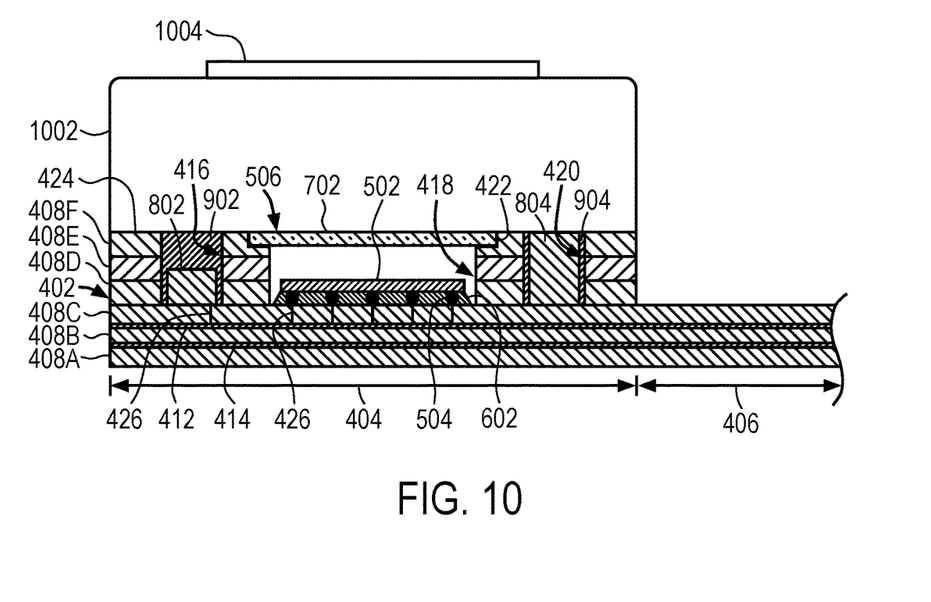
FIG. 10 illustrates the further processing step of mounting a voice coil motor and lens barrel assembly to the circuit carrier substrate.

FIG. 10 illustrates the further processing step of mounting a voice coil motor and lens barrel assembly to the circuit carrier substrate. Representatively, voice coil motor 1002 within lens barrel 1004 therein may be positioned over image sensor 502. The voice coil motor 1002 may then be mounted directly to the top side 424 of circuit carrier substrate 402 using any suitable mounting material (e.g. an epoxy) to complete the camera module assembly.

Figure 11:
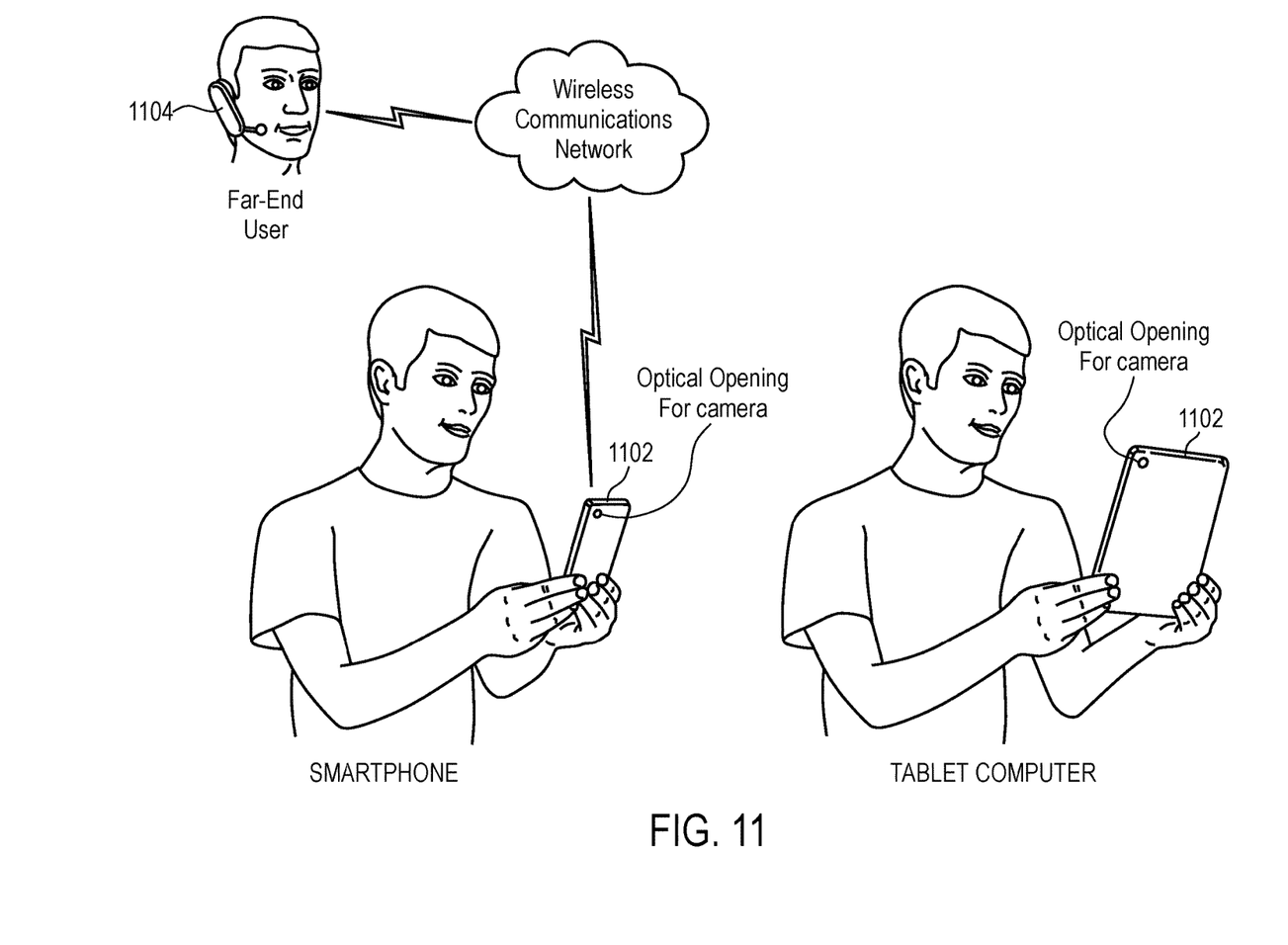
FIG. 11 illustrates one embodiment of a simplified schematic view of one embodiment of an electronic device in which a camera module may be implemented.

FIG. 11 illustrates one embodiment of a simplified schematic view of one embodiment of an electronic device in which a camera module may be implemented. As seen in FIG. 11, the camera module may be integrated within a consumer electronic device 1102 such as a smart phone with which a user can conduct a call with a far-end user of a communications device 1104 over a wireless communications network; in another example, the camera module may be integrated within the housing of a tablet computer 1102. These are just two examples of where the camera module described herein may be used, it is contemplated, however, that the camera module may be used with any type of electronic device in which a camera module is desired, for example, a desk top computing device or other display device.

Figure 12:
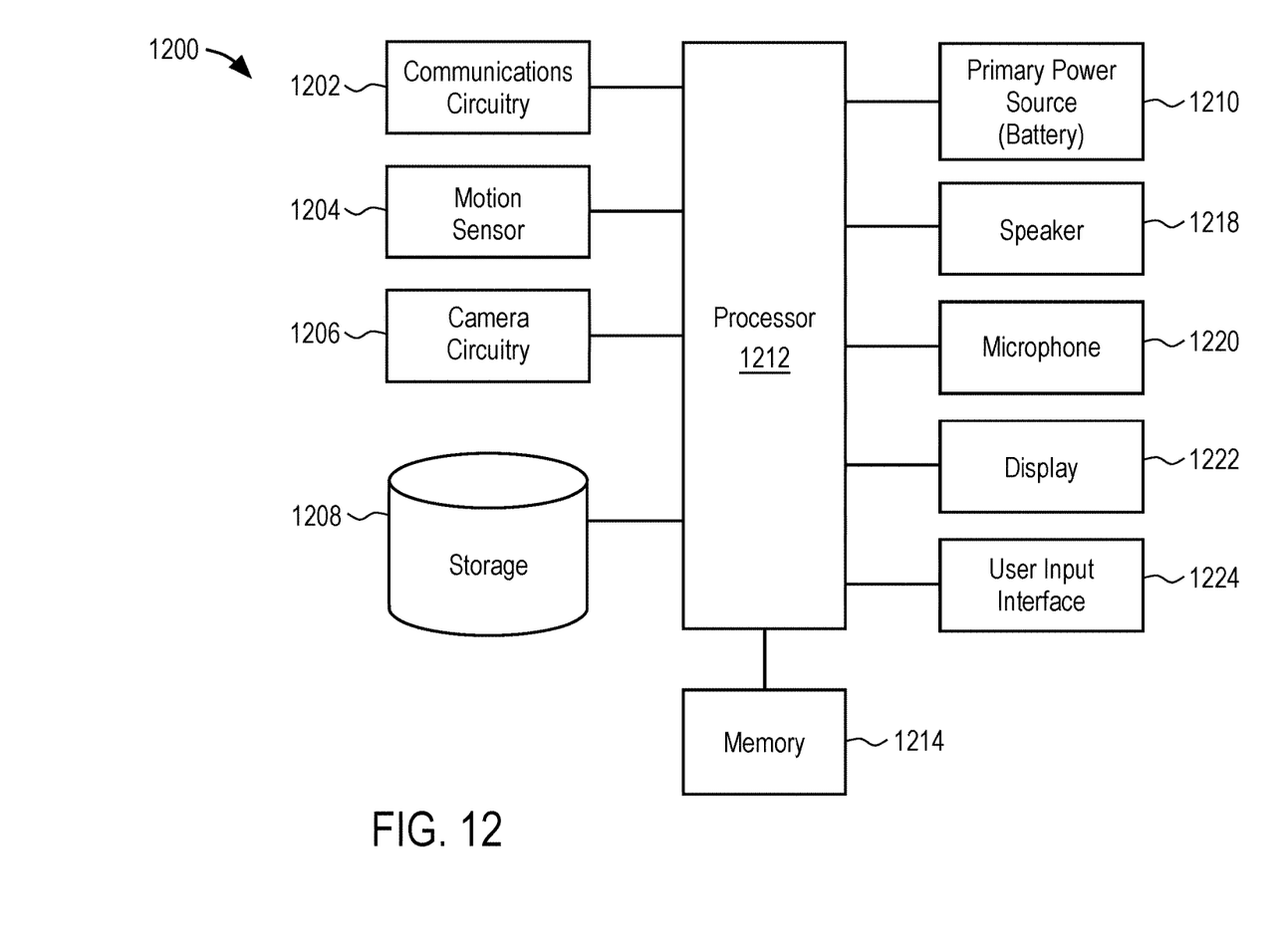
FIG. 12 illustrates a block diagram of some of the constituent components of an embodiment of an electronic device in which an embodiment of the invention may be implemented.

FIG. 12 illustrates a block diagram of some of the constituent components of an embodiment of an electronic device in which an embodiment of the invention may be implemented. Device 1200 may be any one of several different types of consumer electronic devices. For example, the device 1200 may be any camera-equipped mobile device, such as a cellular phone, a smart phone, a media player, or a tablet-like portable computer.

In this aspect, electronic device 1200 includes a processor 1212 that interacts with camera circuitry 1206, motion sensor 1204, storage 1208, memory 1214, display 1222, and user input interface 1224. Main processor 1212 may also interact with communications circuitry 1202, primary power source 1210, speaker 1218, and microphone 1220. The various components of the electronic device 1200 may be digitally interconnected and used or managed by a software stack being executed by the processor 1212. Many of the components shown or described here may be implemented as one or more dedicated hardware units and/or a programmed processor (software being executed by a processor, e.g., the processor 1212).

The processor 1212 controls the overall operation of the device 1200 by performing some or all of the operations of one or more applications or operating system programs implemented on the device 1200, by executing instructions for it (software code and data) that may be found in the storage 1208. The processor 1212 may, for example, drive the display 1222 and receive user inputs through the user input interface 1224 (which may be integrated with the display 1222 as part of a single, touch sensitive display panel). In addition, processor 1212 may send an audio signal to speaker 1218 to facilitate operation of speaker 1218.

Storage 1208 provides a relatively large amount of "permanent" data storage, using nonvolatile solid state memory (e.g., flash storage) and/or a kinetic nonvolatile storage device (e.g., rotating magnetic disk drive). Storage 1208 may include both local storage and storage space on a remote server. Storage 1208 may store data as well as software components that control and manage, at a higher level, the different functions of the device 1200.

In addition to storage 1208, there may be memory 1214, also referred to as main memory or program memory, which provides relatively fast access to stored code and data that is being executed by the processor 1212. Memory 1214 may include solid state random access memory (RAM), e.g., static RAM or dynamic RAM. There may be one or more processors, e.g., processor 1212, that run or execute various software programs, modules, or sets of instructions (e.g., applications) that, while stored permanently in the storage 1208, have been transferred to the memory 1214 for execution, to perform the various functions described above.

The device 1200 may include communications circuitry 1202. Communications circuitry 1202 may include components used for wired or wireless communications, such as two-way conversations and data transfers. For example, communications circuitry 1202 may include RF communications circuitry that is coupled to an antenna, so that the user of the device 1200 can place or receive a call through a wireless communications network. The RF communications circuitry may include a RF transceiver and a cellular baseband processor to enable the call through a cellular network. For example, communications circuitry 1202 may include Wi-Fi communications circuitry so that the user of the device 1200 may place or initiate a call using voice over Internet Protocol (VOIP) connection, transfer data through a wireless local area network.

The device may include a microphone 1220. In this aspect, microphone 1220 may be an acoustic-to-electric transducer or sensor that converts sound in air into an electrical signal. The microphone circuitry may be electrically connected to processor 1212 and power source 1210 to facilitate the microphone operation (e.g. tilting).

The device 1200 may include a motion sensor 1204, also referred to as an inertial sensor, that may be used to detect movement of the device 1200. The motion sensor 1204 may include a position, orientation, or movement (POM) sensor, such as an accelerometer, a gyroscope, a light sensor, an infrared (IR) sensor, a proximity sensor, a capacitive proximity sensor, an acoustic sensor, a sonic or sonar sensor, a radar sensor, an image sensor, a video sensor, a global positioning (GPS) detector, an RF or acoustic doppler detector, a compass, a magnetometer, or other like sensor. For example, the motion sensor 1204 may be a light sensor that detects movement or absence of movement of the device 1200, by detecting the intensity of ambient light or a sudden change in the intensity of ambient light. The motion sensor 1204 generates a signal based on at least one of a position, orientation, and movement of the device 1200. The signal may include the character of the motion, such as acceleration, velocity, direction, directional change, duration, amplitude, frequency, or any other characterization of movement. The processor 1212 receives the sensor signal and controls one or more operations of the device 1200 based in part on the sensor signal.

The device 1200 also includes camera circuitry 1206 that implements the digital camera functionality of the device 1200. One or more camera modules having image sensors (e.g. camera module assembly 100) are built into the device 1200, and each may be located at a focal plane of an optical system that includes a respective lens. An optical image of a scene within the camera's field of view is formed on the image sensor, and the sensor responds by capturing the scene in the form of a digital image or picture consisting of pixels that may then be stored in storage 1208. The camera circuitry 1206 may also be used to capture video images of a scene.

Device 1200 also includes primary power source 1210, such as a built in battery, as a primary power supply.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A camera module assembly comprising:
   a circuit carrier substrate having a first region integrally formed with a second region, the second region being movable with respect to the first region; and
   an image sensor device positioned within a cavity formed within a portion of the circuit carrier substrate in the first region, the image sensor device having a conductive via and a redistribution layer formed therein, wherein the conductive via and the redistribution layer are electrically connected to the circuit carrier substrate along a side of the image sensor device facing the circuit carrier substrate.

2. The camera module assembly of claim 1 wherein the first region is rigid and the second region is flexible.

3. The camera module assembly of claim 1 further comprising an electronic component embedded in the first region of the circuit carrier substrate and electrically connected to the circuit carrier substrate.

4. The camera module assembly of claim 3 wherein the electronic component is an active electronic component partially embedded within the first region of the circuit carrier substrate.

5. The camera module assembly of claim 3 wherein the electronic component is a passive electronic component completely embedded within the first region of the circuit carrier substrate.

6. The camera module assembly of claim 1 further comprising a transparent member positioned within a receiving channel in the cavity to enclose the image sensor device within the cavity.

7. The camera module assembly of claim 1 wherein the conductive via is a through silicon via, the through silicon via being electrically connected to circuitry along the cavity that is within the circuit carrier substrate by the redistribution layer.

8. The camera module assembly of claim 1 wherein a conductive material is applied between a bottom surface of the cavity and the image sensor device to electrically connect the conductive via to the circuit carrier substrate.

9. The camera module assembly of claim 1 wherein a bottom surface of the cavity is flat.

10. The camera module assembly of claim 1 further comprising a voice coil motor assembly positioned over the image sensor device and attached to the first region of the circuit carrier substrate.

11. A camera module assembly comprising:
a circuit carrier substrate, the circuit carrier substrate having a first cavity and a second cavity formed therein, each of the first cavity and the second cavity having a bottom surface and an opening along a top side of the circuit carrier substrate;
an image sensor device positioned within the first cavity formed in the circuit carrier substrate, the image sensor device having an image capture side facing the opening of the first cavity and a connection side facing the bottom surface of the first cavity, and a conductive via extending between the image capture side and the connection side, wherein the conductive via is electrically connected to the circuit carrier substrate at the connection side of the image sensor device; and
an electronic component positioned within the second cavity, the electronic component being electrically connected to the circuit carrier substrate.

12. The camera module assembly of claim 11 wherein the first cavity and the second cavity are formed within a first region of the circuit carrier substrate, and the circuit carrier substrate further comprises a second region that is thinner than the first region.

13. The camera module assembly of claim 12 wherein the first region and the second region are integrally formed as one inseparable carrier structure.

14. The camera module assembly of claim 11 wherein the circuit carrier substrate comprises a plurality of substrate layers.

15. The camera module assembly of claim 14 wherein more than at least one of the plurality of substrate layers extends continuously from a first end to a second end of the circuit carrier substrate.

16. The camera module assembly of claim 11 wherein a z-height of the first cavity is greater than or equal to a z-height of the image sensor device and the image sensor device does not extend through the first cavity opening.

17. The camera module assembly of claim 11 wherein the electronic component is completely embedded within the second cavity.

18. The camera module assembly of claim 11 wherein the electronic component is exposed through the opening in the second cavity.

19. A method of producing a camera module assembly, the method comprising:
providing an integrally formed circuit carrier substrate having a first region and a second region that is movable with respect to the first region, and a first cavity and a second cavity formed within a portion of the circuit carrier substrate within the first region;
positioning an image sensor device within the first cavity and an electronic component within the second cavity, the image sensor device having an image capture side exposed through an opening of the first cavity and a connection side facing a bottom surface of the first cavity, a conductive via extending between the image capture side and the connection side, and a redistribution layer formed within the connection side;
applying a conductive material between the connection side of the image sensor device and the bottom surface of the first cavity to electrically connect the conductive via and the redistribution layer to the circuit carrier substrate.

20. The method of claim 19 further introducing an embedding material into the second cavity to embed the electronic component within the second cavity.

\* \* \* \* \*